(12) United States Patent
Chen et al.

(10) Patent No.: US 12,272,585 B2
(45) Date of Patent: Apr. 8, 2025

(54) WAFER CHUCK STRUCTURE WITH HOLES IN UPPER SURFACE TO IMPROVE TEMPERATURE UNIFORMITY

(71) Applicant: Taiwan Semiconductor Manufacturing Co., Ltd., Hsinchu (TW)

(72) Inventors: Ting-Jung Chen, Kaohsiung (TW); Shih-Wei Lin, Taipei (TW); Lee-Chuan Tseng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 898 days.

(21) Appl. No.: 17/241,666

(22) Filed: Apr. 27, 2021

(65) Prior Publication Data
US 2022/0344193 A1    Oct. 27, 2022

(51) Int. Cl.
| | |
|---|---|
| *H01L 21/683* | (2006.01) |
| *C23C 14/50* | (2006.01) |
| *C23C 14/54* | (2006.01) |
| *C23C 14/58* | (2006.01) |
| *C23C 16/458* | (2006.01) |
| *C23C 16/46* | (2006.01) |
| *H01J 37/32* | (2006.01) |

(Continued)

(52) U.S. Cl.
CPC .......... *H01L 21/6833* (2013.01); *C23C 14/50* (2013.01); *C23C 14/541* (2013.01); *C23C 14/5873* (2013.01); *C23C 16/4586* (2013.01); *C23C 16/466* (2013.01); *H01J 37/32724* (2013.01); *H01L 21/67109* (2013.01); *H01J 2237/002* (2013.01); *H01J 2237/2007* (2013.01); *H01L 21/67069* (2013.01); *H01L 21/76802* (2013.01)

(58) Field of Classification Search
None
See application file for complete search history.

(56) References Cited

U.S. PATENT DOCUMENTS

| | | | | |
|---|---|---|---|---|
| 5,382,311 | A * | 1/1995 | Ishikawa | ............... C23C 16/466 118/728 |
| 6,475,917 | B1 * | 11/2002 | Shen | .................. H01L 21/31055 438/719 |
| 10,825,664 | B2 | 11/2020 | Watanabe et al. | |

(Continued)

*Primary Examiner* — Allan W. Olsen
(74) *Attorney, Agent, or Firm* — Eschweiler & Potashnik, LLC

(57) ABSTRACT

In some embodiments, the present disclosure relates to a process tool that includes a chamber housing defined by a processing chamber, and a wafer chuck structure arranged within the processing chamber. The wafer chuck structure is configured to hold a wafer during a fabrication process. The wafer chuck includes a lower portion and an upper portion arranged over the lower portion. The lower portion includes trenches extending from a topmost surface towards a bottommost surface of the lower portion. The upper portion includes openings that are holes, extend completely through the upper portion, and directly overlie the trenches of the lower portion. Multiple of the openings directly overlie each trench. Further, cooling gas piping is coupled to the trenches of the lower portion of the wafer chuck structure, and a cooling gas source is coupled to the cooling gas piping.

20 Claims, 11 Drawing Sheets

(51) Int. Cl.
*H01L 21/67* (2006.01)
*H01L 21/768* (2006.01)

(56) References Cited

U.S. PATENT DOCUMENTS

| | | | |
|---|---|---|---|
| 2005/0189074 A1* | 9/2005 | Kasai | H01L 21/6831 |
| | | | 156/345.33 |
| 2007/0283891 A1* | 12/2007 | Okayama | H01L 21/6831 |
| | | | 118/728 |
| 2015/0332942 A1* | 11/2015 | Peh | H01L 21/67248 |
| | | | 165/61 |
| 2015/0348813 A1* | 12/2015 | Mangalore | H05B 6/105 |
| | | | 219/634 |
| 2018/0277418 A1 | 9/2018 | Sato et al. | |
| 2021/0143043 A1* | 5/2021 | Hwang | H01L 21/67109 |

* cited by examiner

WAFER CHUCK STRUCTURE WITH HOLES IN UPPER SURFACE TO IMPROVE TEMPERATURE UNIFORMITY

BACKGROUND

Semiconductor device fabrication is a process used to create integrated circuits that are present in everyday electronic devices. The fabrication process is a multiple-step sequence comprising deposition, photolithographic, and chemical processing steps during which electronic circuits are gradually created on a wafer. Many integrated circuits are formed on a semiconductor wafer at one time, and then the semiconductor wafer undergoes a dicing processing to cut the semiconductor wafer into substantially uniform chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
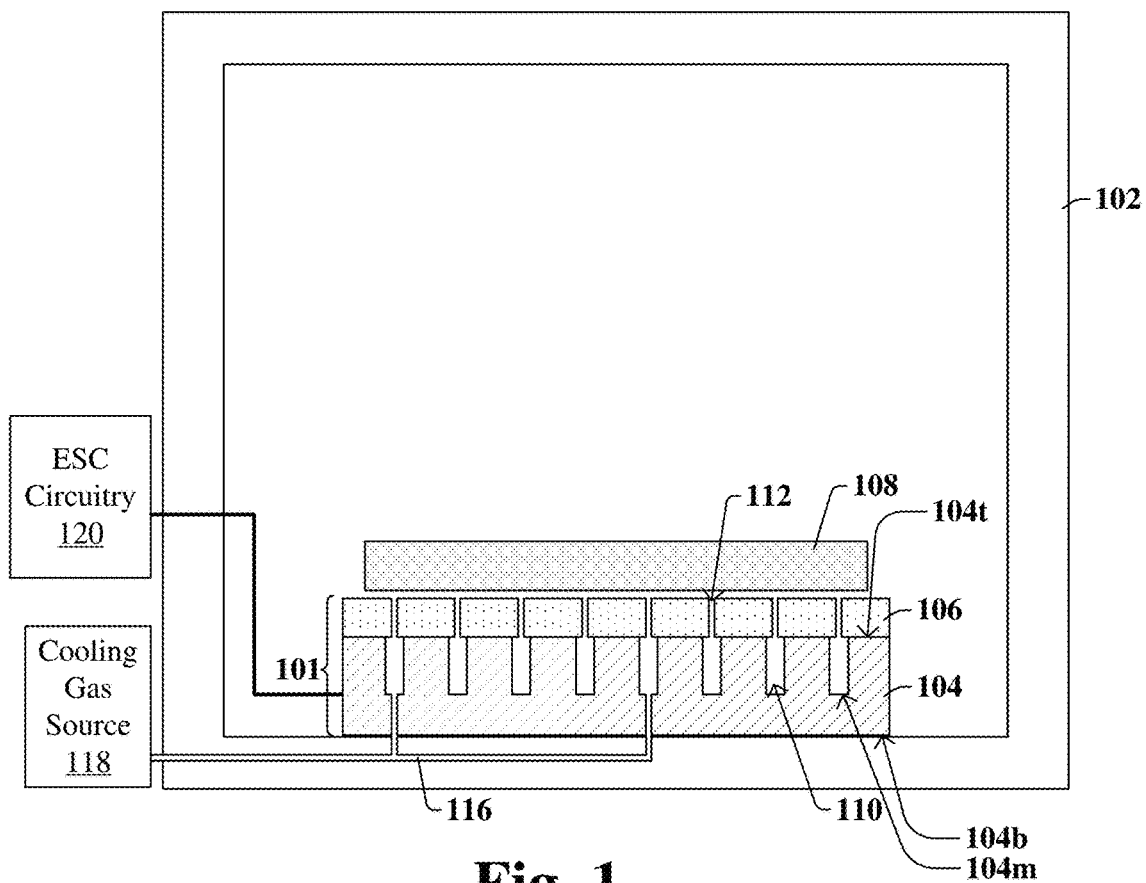
FIG. 1 illustrates a cross-sectional view of some embodiments of a processing chamber comprising a wafer chuck structure having an upper portion with holes such that during a processing step, cooling gas is evenly distributed to a wafer arranged on the upper portion of the wafer chuck structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device often comprises multiple layers (e.g., dielectric, semiconductor, and/or conductive layers/features) arranged over a substrate. The multiple layers are formed through various deposition, photolithography, and removal processes. Temperature conditions during processing steps, such as deposition and removal processes, effect the control and predictability of the processing steps. For example, an etch rate (e.g., amount of material per time) may depend greatly on temperature conditions because etching processes are based on chemical reactions and/or bombardment of atoms. Chemical reactions and bombardment of atoms can both be accelerated by temperature. In some instances, piping is integrated into a wafer chuck structure such that during processing steps, a cooling gas can be directed towards the bottom of a wafer on the wafer chuck structure to control the temperature of the wafer and layers arranged on the wafer.

For example, a wafer chuck structure may comprise trenches arranged in ring-like structures from a top-view perspective, wherein piping for cooling gas is coupled to the trenches. Thus, during a removal step, for example, the cooling gas is directed through the trenches of the wafer chuck structure to control the temperature of the wafer and layer(s) to be patterned by the removal step. When the temperature of the layer(s) to be patterned is more uniform throughout the wafer, the etch rate of the removal process of the layer(s) is also more uniform. Then, multiple portions of the layer(s) on the wafer may be reliably patterned at a same time.

However, when the trenches of the wafer chuck structure are in a ring-like structure, the uniformity of the cooling gas distribution to the wafer and layer(s) may be poor. For example, areas of the wafer and layer(s) arranged directly over the trenches may be cooler than areas not arranged directly over the trenches. As a result, the etch rate may be faster or slower in colder areas of the layer(s) compared to warmer areas of the layer(s). The resulting cavities formed in the layer(s) may then have different depths due to the varying etch rates.

Various embodiments of the present disclosure relate to a wafer chuck comprising a lower portion having trenches exhibiting ring-like structures and an upper portion arranged over the lower portion and having openings that are hole-like structures arranged over the trenches of the lower portion. During a removal process, the hole-like openings provide a more even distribution of cooling gas throughout the wafer and various layer(s) on the wafer to reduce a variation in etch rate and thus, to improve the control and uniformity of the etching depth throughout the area of the layer(s) that are patterned.

FIG. 1 illustrates a cross-sectional view 100 of some embodiments of a process tool comprising a wafer chuck configured to hold a wafer during a removal process and comprising trenches and hole-like openings for a cooling gas to enter during processing steps.

The process tool of FIG. 1 comprises a chamber housing 102 defining a processing chamber. In some embodiments, the processing chamber is configured for use for a removal process (e.g., etching), a deposition process, or the like. For example, in some embodiments, wherein the processing chamber is configured for use for an etching process, plasma gas sources and corresponding circuitry (not shown) may be arranged within the chamber housing 102. In some embodiments, a wafer chuck structure 101 is arranged near a bottom of the processing chamber and within the chamber housing 102. The wafer chuck structure 101 is configured to hold onto a wafer 108 during a fabrication process performed in the processing chamber.

In some embodiments, the wafer chuck structure 101 is an electrostatic chuck (ESC) and thus, is coupled to ESC circuitry 120. In some embodiments, the ESC circuitry 120 is configured to turn the wafer chuck structure 101 "ON" to hold onto the wafer 108 using electrostatic force. For example, in some embodiments, the wafer chuck structure 101 comprises electrostatic contacts that are turned "ON" by applying a voltage to the electrostatic contacts with the ESC circuitry 120. In some embodiments, the electrostatic contacts provide an electrostatic force that holds the wafer 108 onto the wafer chuck structure 101.

In some embodiments, the wafer chuck structure 101 comprises a lower portion 104 and an upper portion 106 arranged over the lower portion 104. In some embodiments, the lower portion 104 comprises a first material, and the upper portion 106 comprises a second material different than the first material. For example, in some embodiments, the lower portion 104 comprises a metal such as aluminum or the like. In some embodiments, the upper portion 106 comprises a ceramic material or some other material different than the lower portion 104. In some embodiments, the wafer 108 is arranged directly over the upper portion 106 of the wafer chuck structure 101.

In some embodiments, the lower portion 104 of the wafer chuck structure 101 comprises trenches 110 that extend from a topmost surface 104t of the lower portion 104 of the wafer chuck structure 101 towards a bottommost surface 104b of the wafer chuck structure 101. In some embodiments, the trenches 110 have lower surfaces defined by a middle surface 104m of the lower portion 104 of the wafer chuck structure 101, wherein the middle surface 104m is arranged between the topmost surface 104t and the bottommost surface 104b of the lower portion 104 of the wafer chuck structure 101. In some embodiments, the trenches 110 are coupled to cooling gas piping 116 coupled to a cooling gas source 118. In some embodiments, the cooling gas source 118 is arranged outside of the chamber housing 102, whereas in some other embodiments, the cooling gas source 118 may be arranged within the chamber housing 102. In some embodiments, the cooling gas piping 116 is only coupled to some of the trenches 110 from the cross-sectional view 100 because the cooling gas piping 116 is coupled to other portions of the trenches 110 visible from other cross-sectional view perspectives. In other embodiments, some of the trenches 110 in the cross-sectional view 100 may also be coupled to one another. In other words, each trench 110 is coupled to the cooling gas source 118 in some embodiments.

In some embodiments, the upper portion 106 of the wafer chuck structure 101 comprises hole-like openings 112 that extend completely through the upper portion 106. In some embodiments, the hole-like openings 112 of the upper portion 106 directly overlie the trenches 110 of the lower portion 104. As will be described in more detail in FIG. 2, in some embodiments, the trenches 110 of the lower portion 104 may be continuously connected ring-like structures, whereas the hole-like openings 112 of the upper portion 106 are small openings. Thus, in some embodiments, the hole-like openings 112 have a different pattern than the trenches 110. In some embodiments, multiple hole-like openings 112 directly overlie a same trench 110.

In some embodiments, during a fabrication process, the cooling gas source 118 is configured to supply a cooling gas through the cooling gas piping 116, the trenches 110, and the hole-like openings 112 at a specified temperature to direct the cooling gas towards a backside of the wafer 108. The cooling gas helps control and improve the reliability of the fabrication process. For example, in some embodiments, if an etching process is being performed to remove portions of the wafer 108 and/or layers thereupon (not shown), the etch rate of the etching process depends on the temperature of the wafer 108 and/or layers thereupon. Thus, the cooling gas source 118 can be controlled by circuitry to supply the cooling gas towards the wafer 108 and control the etching process. In some embodiments, because of the many hole-like openings 112 arranged below the wafer 108, the cooling gas is more evenly distributed on the wafer 108 to improve the control and reliability of the fabrication process.

Figure 2:
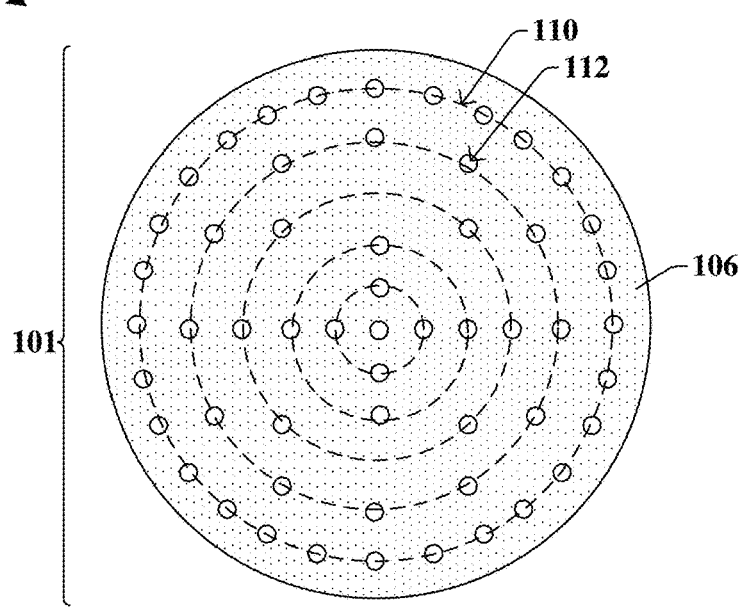
FIGS. 2 and 3 illustrate top-views of some embodiments of the wafer chuck structure comprising an upper portion with holes over a lower portion with trenches connected to the holes.

FIG. 2 illustrates a top-view 200 of some embodiments corresponding to the upper portion of a wafer chuck comprising hole-like openings.

As shown in the top-view 200, in some embodiments, the upper portion 106 of the wafer chuck structure 101 comprises many of the hole-like openings 112. In some embodiments, the hole-like openings 112 are circular-shaped from the top-view 200. In some other embodiments, the hole-like openings 112 exhibit a square, oval, diamond, or some other shape from the top-view 200. In some embodiments, the hole-like openings 112 are evenly distributed directly over the trenches 110 of the lower portion (104 of FIG. 1) of the wafer chuck structure 101. In FIG. 2, the trenches 110 are illustrated with dotted lines because the trenches 110 are arranged behind the upper portion 106 of the wafer chuck structure 101.

Figure 3:
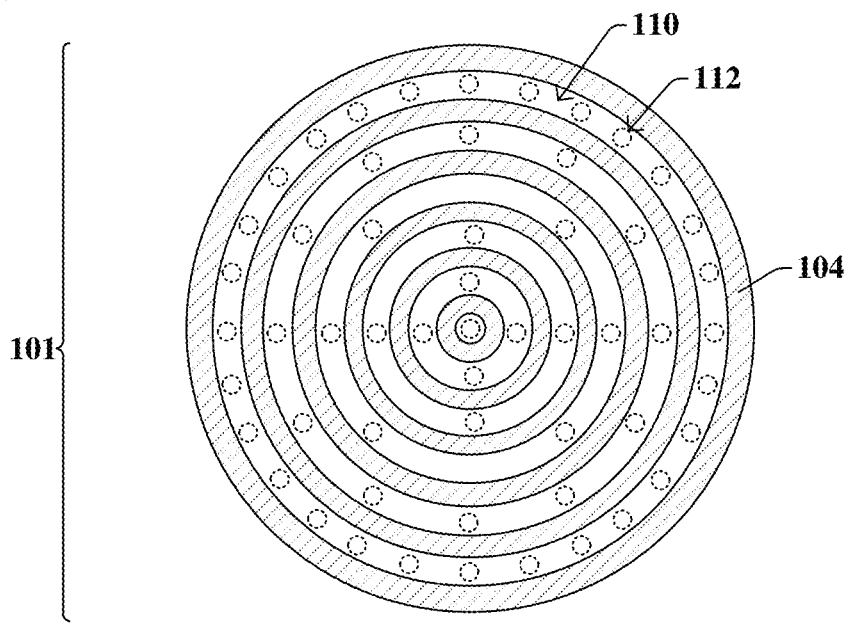

FIG. 3 illustrates a top-view 300 of some embodiments corresponding to the lower portion of a wafer chuck structure comprising trenches.

In some embodiments, the trenches 110 of the lower portion 104 of the wafer chuck structure 101 are ring-like structures that, wherein each trench 110 extends through a large surface area of the lower portion 104 of the wafer chuck structure 101. In some embodiments, the trenches 110 are each coupled to the cooling gas source (118 of FIG. 1). In some embodiments, the trenches 110 are wider than the hole-like openings 112. In some embodiments, because the trenches 110 of the lower portion 104 cover a larger surface area of the lower portion 104 of the wafer chuck structure 101 than the hole-like openings 112 of the upper portion (106 of FIG. 1) of the wafer chuck structure 101, the cooling gas can quickly be distributed through the trenches 110 and then evenly distributed towards a wafer (108 of FIG. 1) through the hole-like openings 112 for more uniform temperature control of the wafer (108 of FIG. 1).

Figure 4:
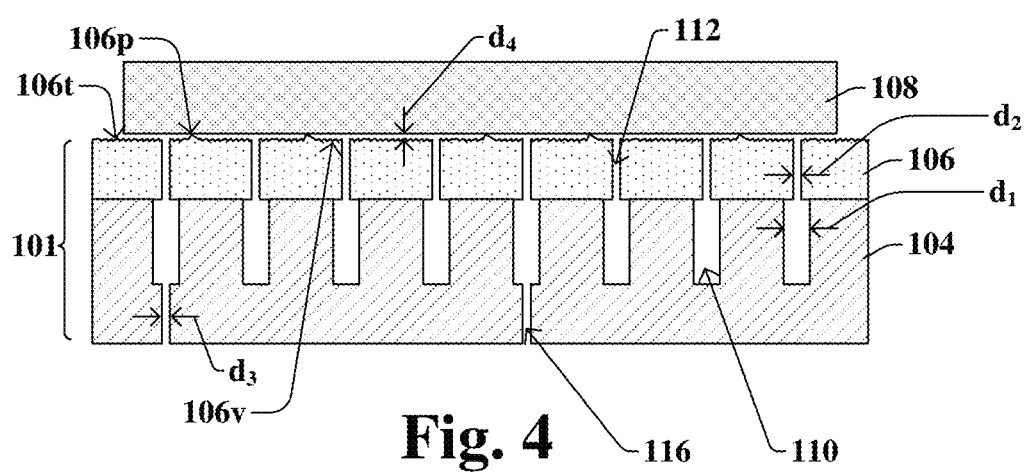
FIGS. 4 and 5 illustrate cross-sectional views of some other embodiments of a wafer chuck structure having an upper portion with holes such that during a processing step, cooling gas is evenly distributed to a wafer arranged on the upper portion of the wafer chuck structure.

FIG. 4 illustrates a cross-sectional view 400 of some other embodiments of a wafer chuck structure comprising an upper portion having hole-like openings coupled to cooling gas piping, wherein an upper surface of the wafer chuck structure is rough.

In some embodiments, a topmost surface 106t of the upper portion 106 of the wafer chuck structure 101 is rough, which may be described as comprising peaks 106p and valleys 106v, wherein the peaks 106p are arranged above the valleys 106v. In some embodiments, the average surface roughness of the topmost surface 106t of the upper portion 106 of the wafer chuck structure 101 is in a range of between approximately 1 micrometer and approximately 100 micrometers, for example. In some embodiments, the wafer 108 directly contacts the peaks 106p of the upper portion 106 of the wafer chuck structure 101, whereas the wafer 108 is spaced apart from the valleys 106v of the upper portion 106 of the wafer chuck structure 101. In some embodiments, the wafer 108 is spaced apart from areas of the upper portion 106 of the wafer chuck structure 101 by a fourth distance $d_4$. In some embodiments, the fourth distance $d_4$ is in a range of between, for example approximately 1 nanometer and approximately 1 millimeter.

In some embodiments, the topmost surface 106t is rough such that the cooling gas may exit through the space between the wafer 108 and the valleys 106v during the fabrication process. As the cooling gas escapes through the spaces between the wafer 108 and the valleys 106v during the fabrication process, new cooling gas at the specified temperature can be directed towards the wafer 108. Thus, the roughness of the topmost surface 106t of the wafer chuck structure 101 aids in continuously directing cooling gas towards the wafer 108 at a specified temperature to control the fabrication process. Further, in some embodiments, the cooling gas flow pressure creates a force between the wafer 108 and the wafer chuck structure 101 that aids in the wafer 108 staying on the wafer chuck structure 101 during the fabrication process.

In some embodiments, the trenches 110 have a width equal to a first distance $d_1$. In some embodiments, the first distance $d_1$ is in a range of between, for example, approximately 1 millimeter and approximately 5 millimeters. In some embodiments, the hole-like openings 112 have a width equal to a second distance $d_2$. In some embodiments, the second distance $d_2$ of the hole-like openings 112 is smaller than the first distance $d_1$ of the trenches 110. In some embodiments, the second distance $d_2$ is in a range of between, for example, approximately 200 micrometers and approximately 1000 micrometers. In some other embodiments, the second distance $d_2$ may be in a range of between, for example approximately 100 micrometers and approximately 500 micrometers. In some embodiments, the cooling gas is more evenly distributed onto the wafer 108 through the hole-like openings 112 because the second distance $d_2$ of the hole-like openings 112 is smaller than the first distance $d_1$ of the trenches 110.

In some embodiments, the cooling gas piping 116 is coupled to the trenches 110 through a bottom or side of the lower portion 104 of the wafer chuck structure 101. In some embodiments, the cooling gas piping 116 is coupled to the trenches 110 in two places, as shown in cross-sectional view 400 of FIG. 4. In some embodiments, the two entries for the cooling gas piping 116 into the trenches 110 allow the cooling gas to quickly distribute throughout the trenches 110 at the specified temperature. Then, in some embodiments, the cooling gas can be evenly distributed towards the wafer 108 through the many hole-like openings 112. In some embodiments, the cooling gas piping 116 has a width equal to a third distance $d_3$. In some embodiments, the third distance $d_3$ is in a range of between, for example, approximately 100 millimeters and approximately 500 millimeters.

Figure 5:
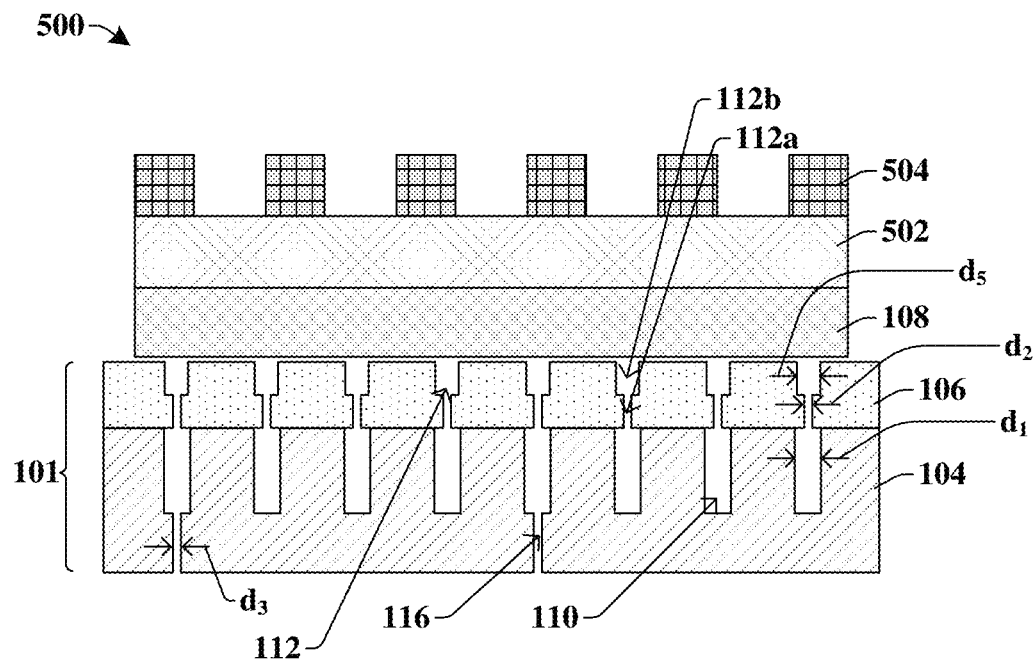

FIG. 5 illustrates a cross-sectional view 500 of some other embodiments of a wafer chuck structure comprising an upper portion having hole-like openings, wherein the holes have a different width at various heights.

In some embodiments, the hole-like openings 112 of the upper portion 106 of the wafer chuck structure 101 have two different widths that vary depending on where the width of the hole-like openings 112 are measured. For example, in some embodiments, the hole-like openings 112 have a lower part 112a that has a width equal to the second distance $d_2$ and have an upper part 112b that has a width equal to a fifth distance $d_5$. In some embodiments, the fifth distance $d_5$ is greater than the first distance $d_1$. In some embodiments, the fifth distance $d_5$ may be in a range of between, for example approximately 100 millimeters and approximately 500 millimeters. In some embodiments, the lower part 112a is arranged below the upper part 112b. In some other embodiments, the lower part 112a (e.g., the narrower part) is arranged above the upper part 112b (e.g., the wider part).

Further, in some embodiments, a layer 502 is arranged over the wafer 108. In some embodiments, the layer 502 may comprise a dielectric material, a metal material, a semiconductor material, or some other suitable material. In some embodiments, a masking structure 504 may be arranged over the layer 502. In some embodiments, the cooling gas is configured to also control the temperature of the layer 502 during an etching process such that portions of the layer 502 may be removed according to the masking structure 504 at a predictable and controllable etch rate.

Figure 6A:
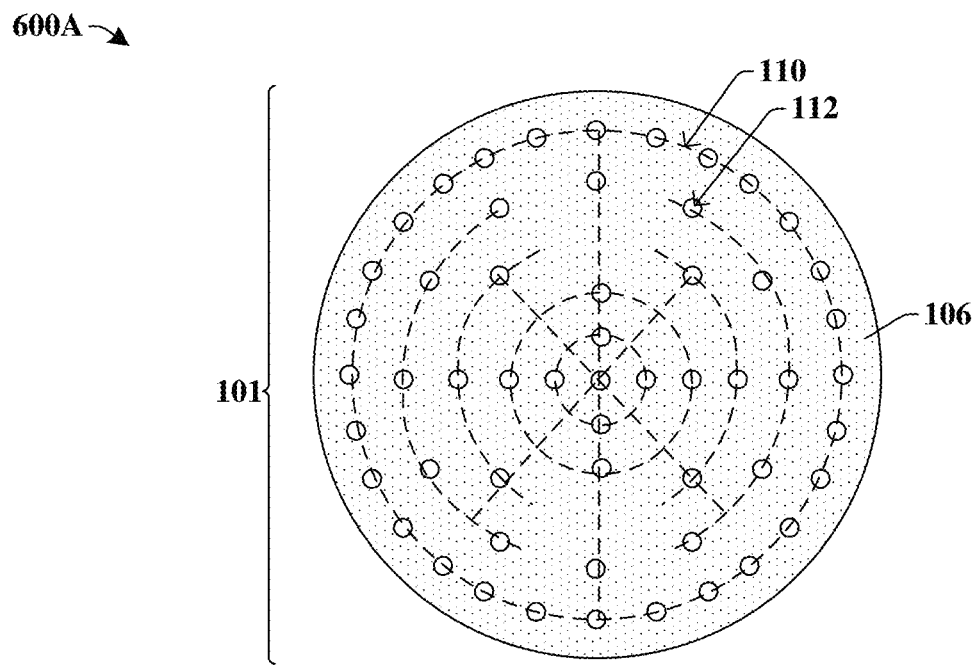
FIGS. 6A and 6B illustrate a top-views of some other embodiments of the wafer chuck structure.

FIG. 6A illustrates a top-view 600A of some other embodiments of an upper portion of a wafer chuck structure comprising hole-like openings coupled to cooling gas piping.

In yet some other embodiments, the trenches 110 may be a combination of ring-like structures, rectangular structures, curved structures, or some other configuration. In some embodiments, the trenches 110 in the cross-sectional view 500, for example, of FIG. 5 may all be continuously connected to one another. In other words, in some embodiments, the lower portion (104 of FIG. 1) of the wafer chuck structure 101 may actually comprise a single trench 110. Nevertheless, multiple hole-like openings 112 directly overlie each trench 110 of the wafer chuck structure 101. Further, in some embodiments, a first surface area of the lower portion (104 of FIG. 1) comprises the trenches 110, and a second surface area of the upper portion 106 comprises the hole-like openings 112. In some embodiments, the first surface area is greater than the second surface area such that the cooling gas directed through the hole-like openings 112 can be more evenly distributed towards the wafer (108 of FIG. 1) for temperature control.

Figure 6B:
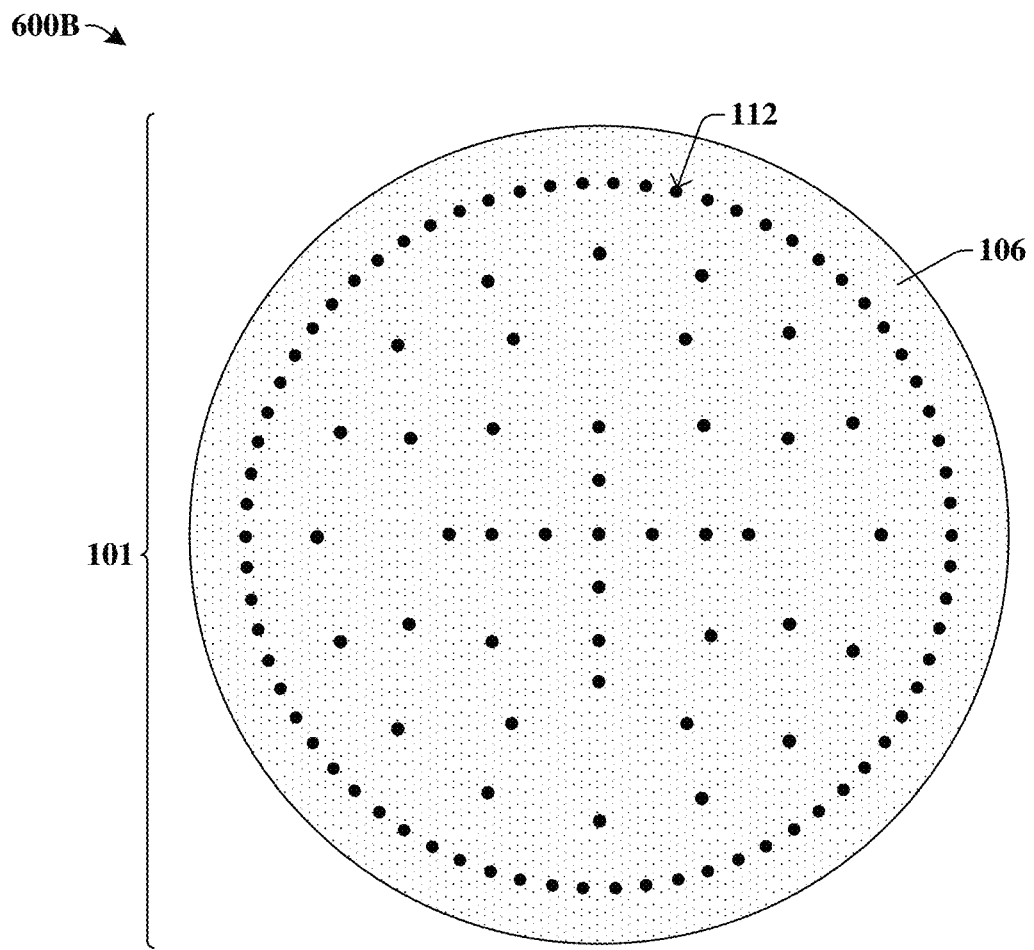

FIG. 6B illustrates a top-view 600B of yet some other embodiments of an upper portion of a wafer chuck structure comprising hole-like openings 112 coupled to cooling gas piping.

The hole-like openings 112 are illustrated as shaded-in circles in FIG. 6B. In yet some other embodiments, there may be substantially more hole-like openings 112 near the outer edge of the upper portion 106 of the wafer chuck structure 101 than towards a center of the upper portion 106 of the chuck wafer structure 101. Such an arrangement may, in some embodiments, improve the ability of the wafer chuck structure 101 to hold onto a wafer (e.g., 108 of FIG. 1). It will be appreciated that a depiction of the trenches (110 of FIG. 1) arranged behind the hole-like openings 112 and the upper portion 106 of the wafer chuck structure 101 is omitted in the top-view of FIG. 6B.

FIGS. 7-12 illustrate various views 700-1200 of some embodiments of a method of arranging a wafer onto a wafer chuck structure comprising hole-like openings for distribution of a cooling gas towards the wafer to perform an etching process and improve etch rate uniformity throughout the wafer. Although FIGS. 7-12 are described in relation to a method, it will be appreciated that the structures disclosed in FIGS. 7-12 are not limited to such a method, but instead may stand alone as structures independent of the method.

Figure 7:
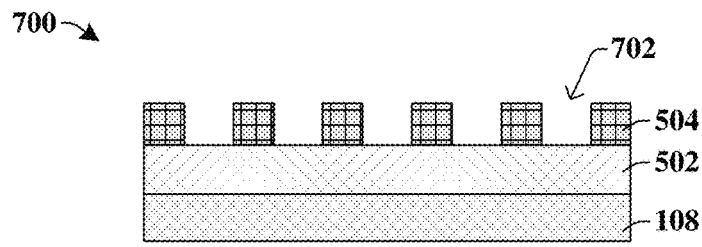
FIGS. 7-12 illustrate various views of some embodiments of a method of patterning a layer on a wafer, wherein the wafer is arranged on a wafer chuck structure having an upper portion with holes such that a cooling gas is evenly distributed to the wafer to improve the uniformity of the patterning of the layer on the wafer.

As shown in cross-sectional view 700 of FIG. 7, a wafer 108 is provided. In some embodiments, the wafer 108 may comprise any type of semiconductor body (e.g., silicon/CMOS bulk, germanium, SiGe, SOI, etc.) such as a semiconductor substrate or one or more die on a wafer, as well as any other type of semiconductor and/or epitaxial layers formed thereon and/or otherwise associated therewith. In some embodiments, a layer 502 is formed over the wafer 108 by way of, for example, a deposition process (e.g., physical vapor deposition (PVD), chemical vapor deposition (CVD), atomic layer deposition (ALD), sputtering, etc.). In some embodiments, the layer 502 comprises a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some other embodiments, the layer 502 may comprise a metal material such as, for example, aluminum, copper, titanium, tungsten, or some other suitable metal material. In yet other embodiments, the layer 502 may comprise a semiconductor material such as, for example, silicon, germanium, or the like.

In some embodiments, a masking structure 504 may be formed over the layer 502. In some embodiments, the masking structure 504 comprises openings 702 that expose portions of the layer 502. In some embodiments, the masking structure 504 may be formed using photolithography and removal (e.g., etching) processes. In some embodiments, the masking structure 504 comprises a photoresist material or a hard mask material.

Figure 8:
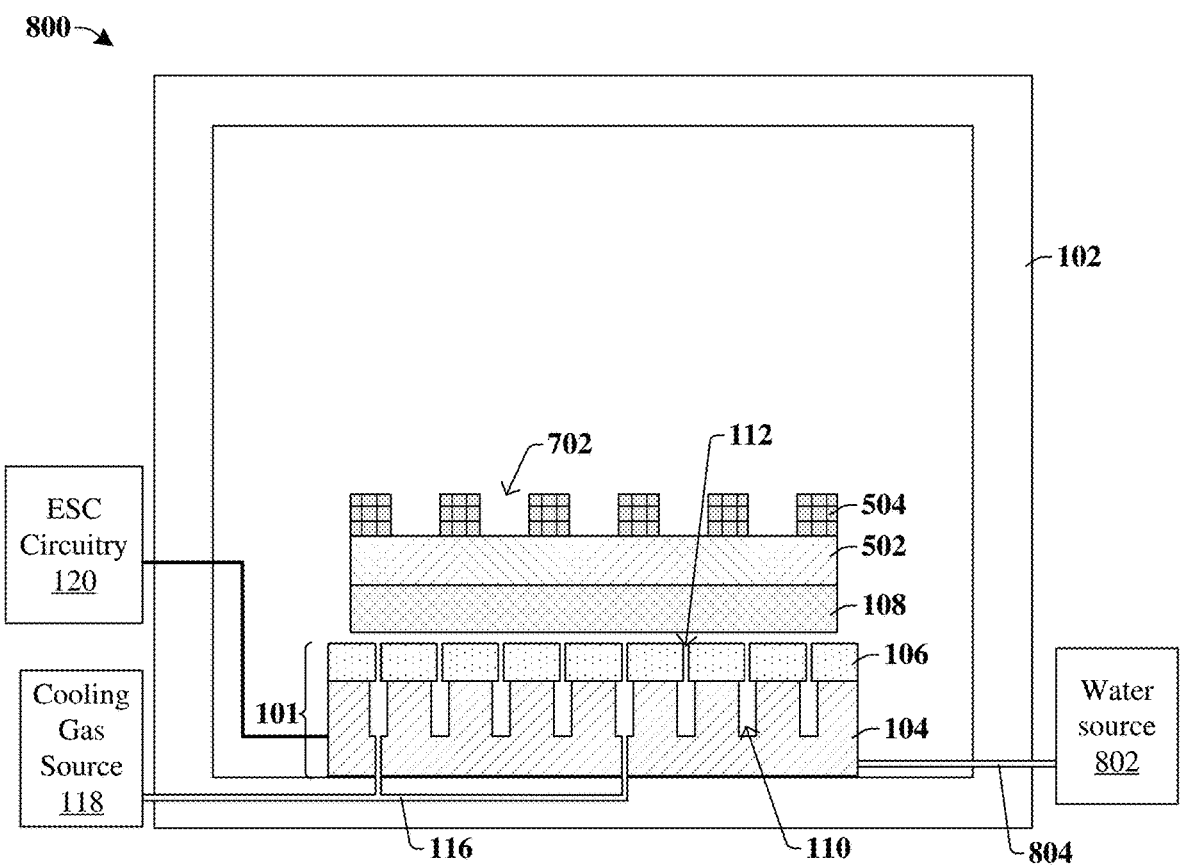

As shown in cross-sectional view 800 of FIG. 8, in some embodiments, the wafer 108 is transported into a processing chamber defined by chamber housing 102. In some embodiments, the wafer 108 is transported onto a wafer chuck structure 101. In some embodiments, the wafer chuck structure 101 comprises a lower portion 104 and an upper portion 106 arranged over the lower portion 104. In some embodiments, the lower portion 104 comprises trenches 110 coupled to cooling gas piping 116. In some embodiments, the upper portion 106 comprises hole-like openings 112 arranged directly over the trenches 110 of the lower portion 104. In some embodiments, cooling gas piping 116 is coupled to a cooling gas source 118. In some embodiments, a water source 802 is coupled to the wafer chuck structure 101 through water piping 804 and is configured to use cool water to cool the lower portion 104 of the wafer chuck structure 101 during fabrication processes.

In some embodiments, the wafer 108 is aligned to and arranged over the wafer chuck structure 101 by transport circuitry (not shown). In some embodiments, the wafer chuck structure 101 is coupled to electrostatic chuck (ESC) circuitry 120. In some embodiments, the ESC circuitry 120 is turned "ON" to apply a voltage to electrostatic contacts on the wafer chuck structure 101 that are configured to hold onto the wafer 108 through electrostatic forces.

Figure 9A:
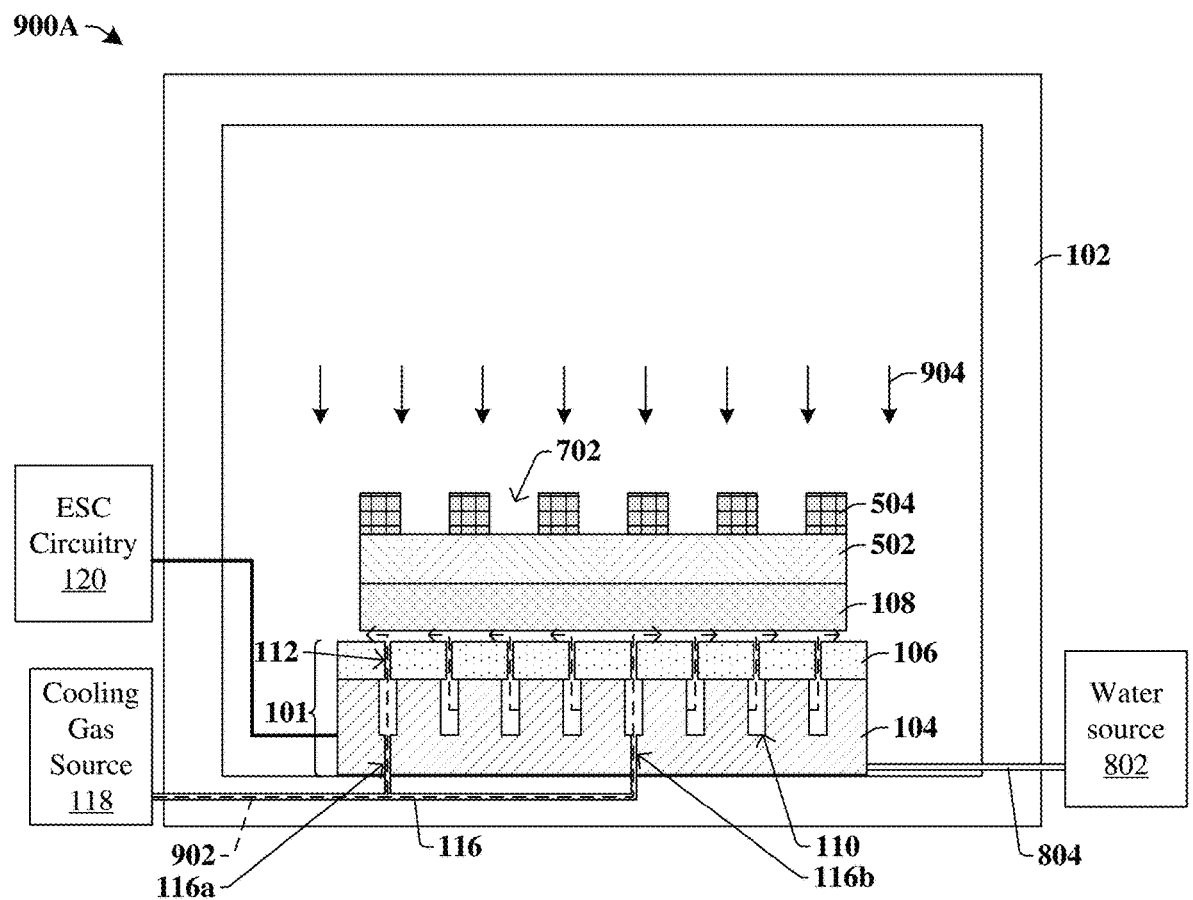
Figure 9B:
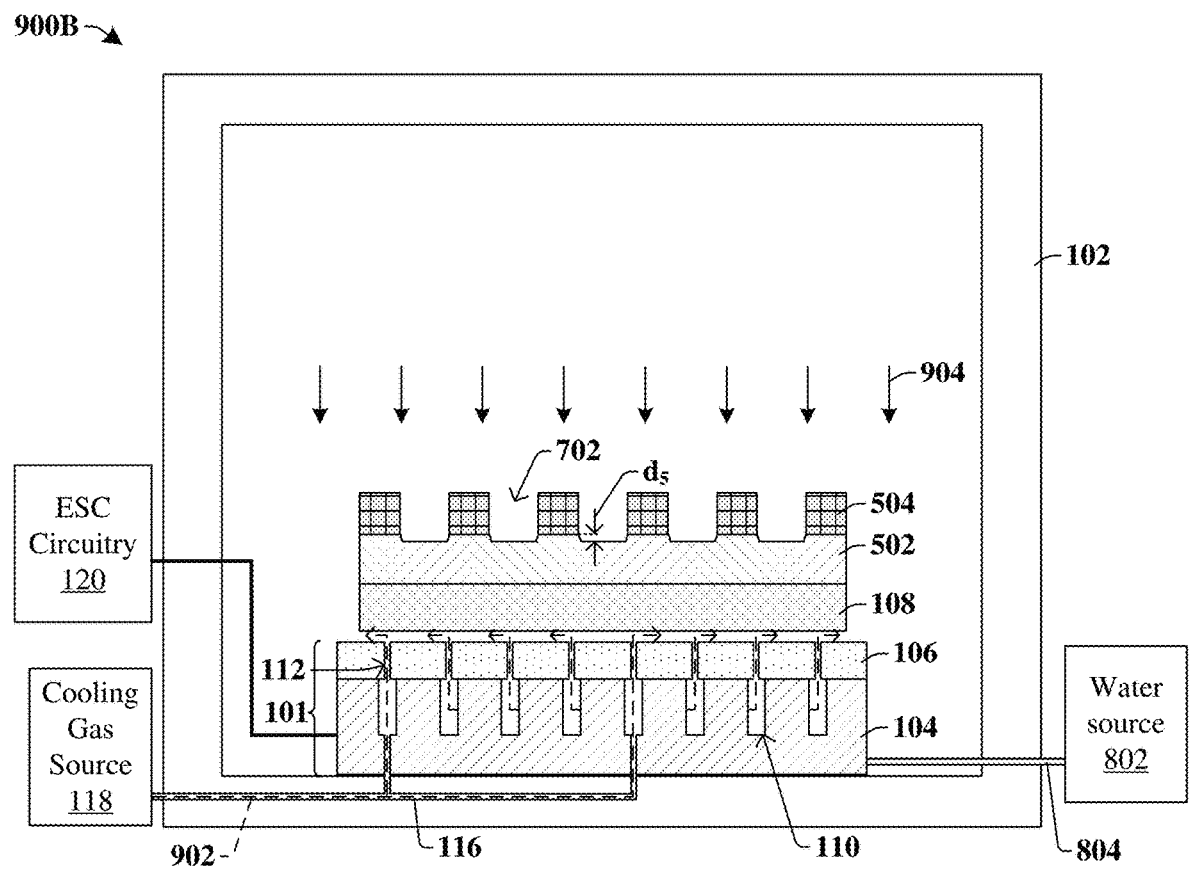
Figure 9C:
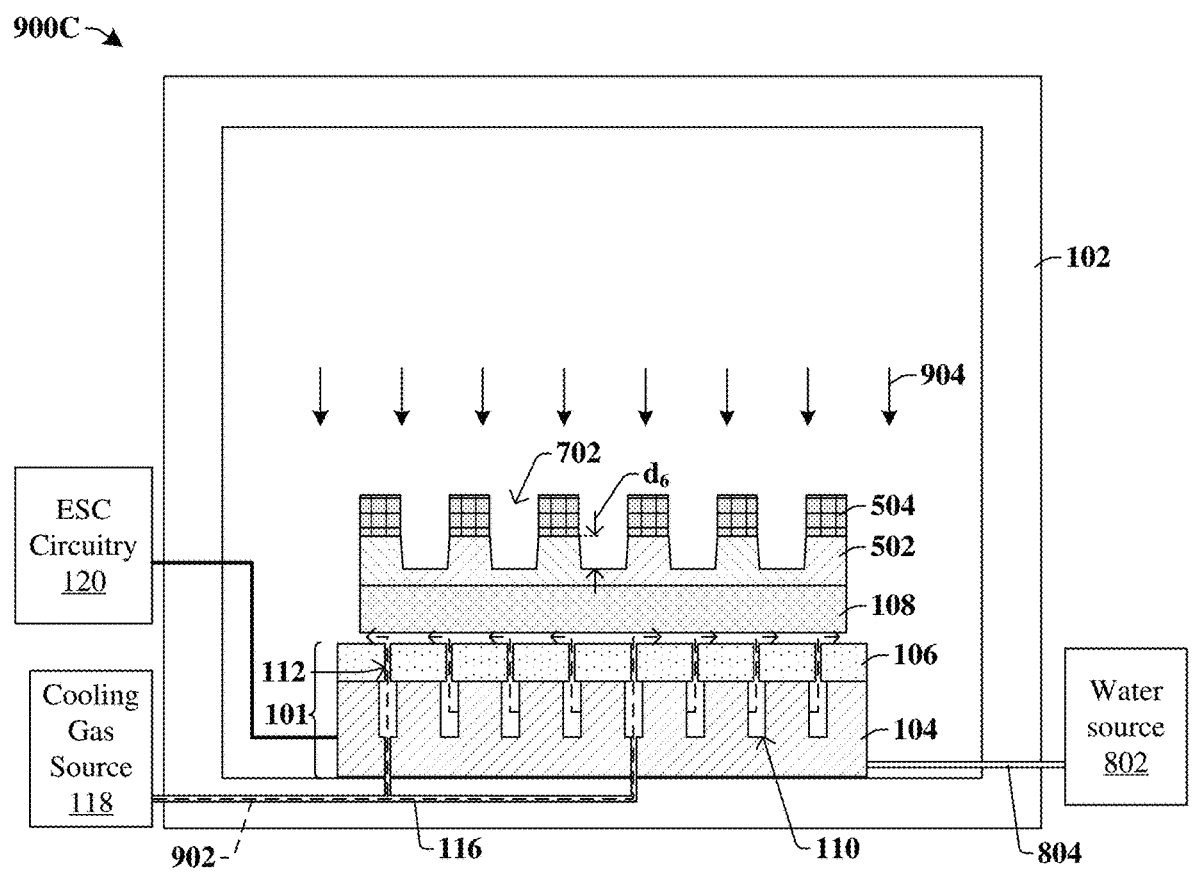

FIGS. 9A, 9B, and 9C illustrate cross-sectional views 900A, 900B, and 900C, respectively, of a removal process, wherein a cooling gas 902 is directed through the wafer chuck structure 101 and towards the wafer 108 to control a temperature of the wafer 108 and thus, to also control the removal process. In some embodiments, FIG. 9A illustrates a first time of the removal process; FIG. 9B illustrates a second time of the removal process after the first time; and FIG. 9C illustrates a third time of the removal process that is after the first and second times. It will be appreciated that FIGS. 9A, 9B, and 9C illustrate a single removal process, but at different times during the removal process to understand how the cooling gas 902 is distributed through the wafer chuck structure 101.

As shown in cross-sectional view 900A of FIG. 9A, in some embodiments, the cooling gas source 118 is turned "ON" to send the cooling gas 902 at a specified temperature through the cooling gas piping 116 and the trenches 110 and hole-like openings 112 of the wafer chuck structure 101. In some embodiments, the cooling gas piping 116 has two points of entry into the trenches 110. In some embodiments, a first entry 116a is arranged near one of the trenches 110 near an outer area of the lower portion 104 of the wafer chuck structure 101, and a second enter 116b is arranged near one of the trenches 110 that is near the center of the lower portion 104 of the wafer chuck structure 101. In some embodiments, the cooling gas 902 is helium or some other suitable inert gas. In some embodiments, the pressure of the cooling gas 902 towards the wafer 108 helps the wafer 108 stay attracted to the wafer chuck structure 101 along with the electrostatic contacts.

In some embodiments, the cooling gas 902 quickly distributes through the trenches 110 because the trenches 110 are wide, and then the cooling gas 902 can evenly distribute towards the wafer through the hole-like openings 112 because the hole-like openings 112 are narrow. In some embodiments, the cooling gas 902 is directed towards the wafer 108 but then flows outwards to and into the processing chamber away from the wafer 108 and wafer chuck structure 101. In some embodiments, the cooling gas 902 escapes through spaces between the wafer 108 and valleys (106v of FIG. 4) of the upper portion 106 of the wafer chuck structure 101. Because the cooling gas 902 can escape from between the wafer 108 and the wafer chuck structure 101, new cooling gas 902 can be continuously pumped towards the wafer 108 to keep exposing the wafer 108 to the cooling gas 902 at the specified temperature to control the temperature of the wafer 108 and the layer 502.

In some embodiments, the water source 802 is also turned "ON" to send cooling water at a specified temperature into piping in the lower portion 104 of the wafer chuck structure 101. The cooling water from the water source 802 can control a temperature of the lower portion 104 of the wafer chuck structure 101 thereby also controlling the temperature of the cooling gas 902 flowing through the lower portion 104 of the wafer chuck structure 101. For example, in some embodiments, the lower portion 104 of the wafer comprises a metal which can easily increase in temperature. Thus, in some embodiments, the water source 802 can reduce the temperature of the lower portion 104 such that the temperature of the cooling gas 902 does not significantly increase while flowing through the trenches 110 of the lower portion 104.

In some embodiments, while the ESC circuitry 120, the cooling gas source 118, and the water source 802 are "ON," a removal process 904 is performed. In some embodiments, the removal process 904 comprises a wet or dry etching process. For example, in some embodiments, the removal process 904 is a dry etching process that utilizes plasma gas to remove portions of the layer 502 uncovered by the masking structure 504. In some embodiments, the etch rate (e.g., amount of material removed per time) of the removal process 904 is controlled by the temperature of the layer 502, which is controlled by the cooling gas 902. In some embodiments, because the hole-like openings 112 of the upper portion 106 of the wafer chuck structure 101 are small openings, wherein multiple hole-like openings 112 are arranged over each trench 110, the cooling gas 902 is more evenly distributed to the wafer 108 to improve temperature uniformity of the layer 502 and thus, of the etch rate of the removal process 904.

As shown in cross-sectional view 900B of FIG. 9B, in some embodiments, after a second time of the removal process 904, portions of the layer 502 are removed according to the openings 702 of the masking structure 504. In some embodiments, after the second time, the removal process 904 removes a first amount of the layer 502 arranged below the openings 702 of the masking structure 504. In some embodiments, the "first amount" of the layer 502 removed is quantified by the etching depth measured between a topmost surface of the layer 502 and a new surface of the layer 502 defined by the removal process 904. In some embodiments, the etching depth after the second time is equal to a fifth distance $d_5$. In some embodiments, the fifth distance $d_5$ may vary throughout the layer 502 because of a variation in temperature of the layer 502 and thus, the variation in the etch rate of the removal process 904. However, the hole-like openings 112 distributed throughout the upper portion 106 of the wafer chuck structure 101 significantly reduce variation of the fifth distance $d_5$.

The etch rate of the removal process 904 is influenced by the temperature of the layer 502. For example, in some embodiments, the layer 502 may comprise silicon nitride, which can be removed by the removal process 904 using an exothermic reaction. The higher the temperature of the layer 502 is, the slower the etch rate is of the removal process 904 for exothermic reactions and thus, the longer it takes for the fifth distance $d_5$ of the layer 502 to be removed. Therefore, when the layer 502 comprises a material removable by an exothermic reaction, the etch rate of the removal process 904 can be increased (e.g., sped up) when the temperature of the layer 502 is reduced using the cooling gas 902. In some other embodiments, the layer 502 may comprise silicon dioxide, which can be removed by the removal process 904 by an endothermic reaction. The higher the temperature of the layer 502 is, the faster the etch rate is of the removal process 904 for endothermic reactions, and thus, the quicker it takes for the fifth distance $d_5$ of the layer 502 to be removed. However, in some instances, the etch rate may be too fast and uncontrollable. Thus, the etch rate of the layer 502 may be slowed down to increase controllability of the removal process 904 when the layer 502 comprises a material that is removable by an endothermic reaction.

Therefore, the cooling gas 902 is evenly distributed towards the wafer 108 and layer 502 to speed up and/or slow down the etch rate of the removal process to improve uniformity of the fifth distance $d_5$ throughout the wafer 108. In some other embodiments, the cooling gas 902 and the wafer chuck structure 101 may be used to control the temperature of the wafer 108 and/or layer 502 during deposition processes, thermal oxidation processes, or other suitable fabrication processes to improve the controllability of the thickness of a layer to be deposited on the wafer 108, for example.

As shown in cross-sectional view 900C of FIG. 9C, after a third time of the removal process 904, the depth of the removed portions of the layer 502 may increase from the fifth distance ($d_5$ of FIG. 9B) to a sixth distance $d_6$. In some embodiments, because of the controllability of the etch rate of the removal process 904 by the cooling gas 902 distribution, an etch stop layer is not needed within the layer 502. Thus, in some embodiments, time (e.g., steps to form an etch stop layer) and materials (e.g., an etch stop layer) are saved because the cooling gas 902 and wafer chuck structure 101 can uniformly control the temperature of the layer 502 which in turn, controls the depth (e.g., sixth distance $d_6$) of the layer 502 to be removed by the removal process 904.

Figure 10:
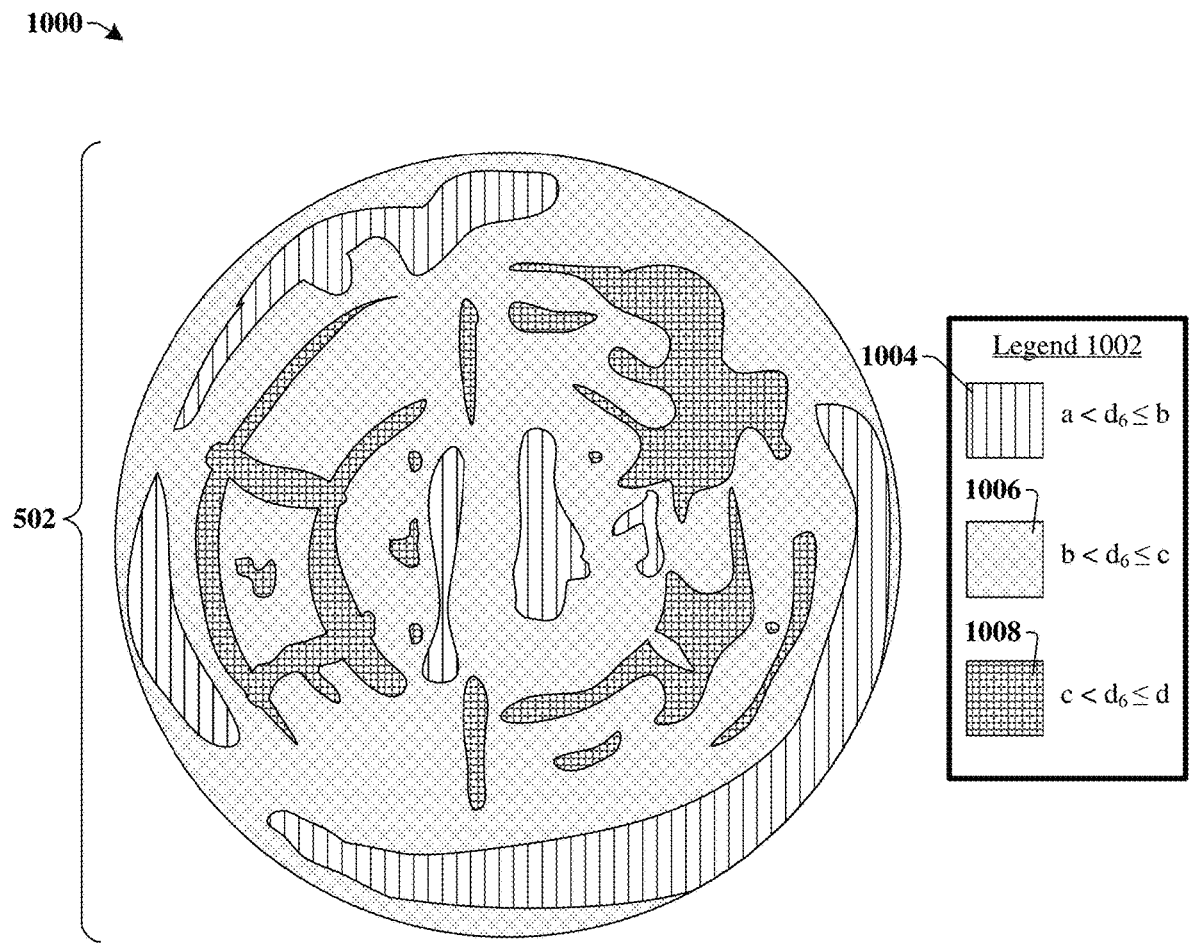

FIG. 10 illustrates a top-view 1000 of some embodiments of the layer 502 after the completion of the removal process (904 of FIG. 9C), wherein different portions of the layer 502 have different patterns to illustrate the uniformity of the removal process (904 of FIG. 9C) based on the etching depth defined by the sixth distance $d_6$. The etching depth variation defined by the sixth distance $d_6$ depends at least in part on the temperature of the layer 502, which is controlled by the cooling gas (902 of FIG. 9C) distribution towards the wafer 108. As shown in the legend 1002, in some embodiments, first regions 1004 of the layer 502 have an etching depth (e.g., sixth distance $d_6$) in a range between a first value a and a second value b. In some embodiments, second regions 1006 of the layer 502 have an etching depth (e.g., sixth distance $d_6$) in a range between the second value b and a third value c. In some embodiments, third regions 1008 of the layer 502 have an etching depth (e.g., sixth distance $d_6$) in a range between the third value c and a fourth value d. The uniformity of the etch rate, which depends at least on the cooling gas (902 of FIG. 9C) distribution uniformity, is improved as the difference between the first value a and the fourth value d of the sixth distance $d_6$ is reduced. In some embodiments, the hole-like openings (112 of FIG. 9C) of the wafer chuck structure (101 of FIG. 9C) improve the cooling gas (902 of FIG. 9C) distribution uniformity, thereby reducing the difference between the first value a and the fourth value d of the sixth distance $d_6$ such that all areas of the layer 502 can undergo a removal process (904 of FIG. 9C) at one time with substantial uniform etching depths throughout all areas of the layer 502.

Figure 11:
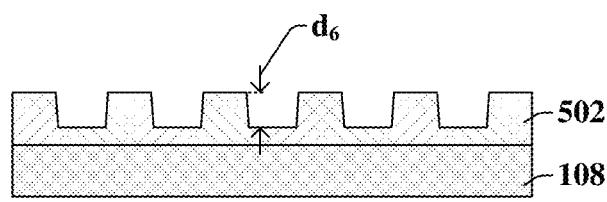

As shown in cross-sectional view 1100 of FIG. 11, in some embodiments, after the completion of the removal process (904 of FIG. 9C), the wafer 108 may be removed from the processing chamber in FIG. 9C. In some embodiments, the masking structure (504 of FIG. 9C) is then removed from the layer 502. In some embodiments, the masking structure (504 of FIG. 9C) is removed by an etching process (e.g., wet etching, dry etching). In some other embodiments, the masking structure (504 of FIG. 9C) may be removed while the wafer 108 is still in the processing chamber of FIG. 9C.

Figure 12:
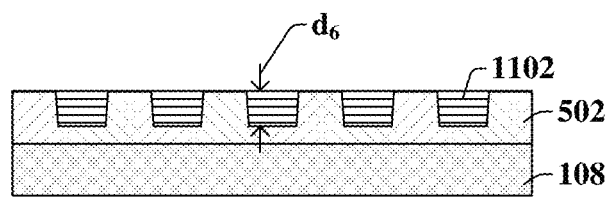

As shown in cross-sectional view 1200 of FIG. 12, in some embodiments, conductive structures 1102 may be formed within the openings of the layer 502 from the removal process (904 of FIG. 9C). In some embodiments, the conductive structures 1102 are formed through various steps of deposition (e.g., PVD, CVD, ALD, sputtering, etc.) and removal (e.g., etching, chemical mechanical planarization) processes. In some embodiments, the conductive structures 1102 comprise copper, aluminum, tungsten, titanium, cobalt, tantalum, or some other suitable conductive material. In some other embodiments, a structure other than a conductive structure 1102 is formed in the openings of the layer 502 such as a dielectric isolation structure, a semiconductor material, or some other suitable feature.

In some embodiments, because the openings of the layer 502 had a substantially uniform etching depth (e.g., sixth distance $d_6$ of FIG. 9C) at least due to the cooling gas (902 of FIG. 9C) distribution towards the wafer 108, the conductive structures 1102 formed over the layer 502 have a substantially same structure (e.g., depth) throughout the wafer 108 such that multiple chips having a same structure can be formed on the wafer 108 at one time.

Figure 13:
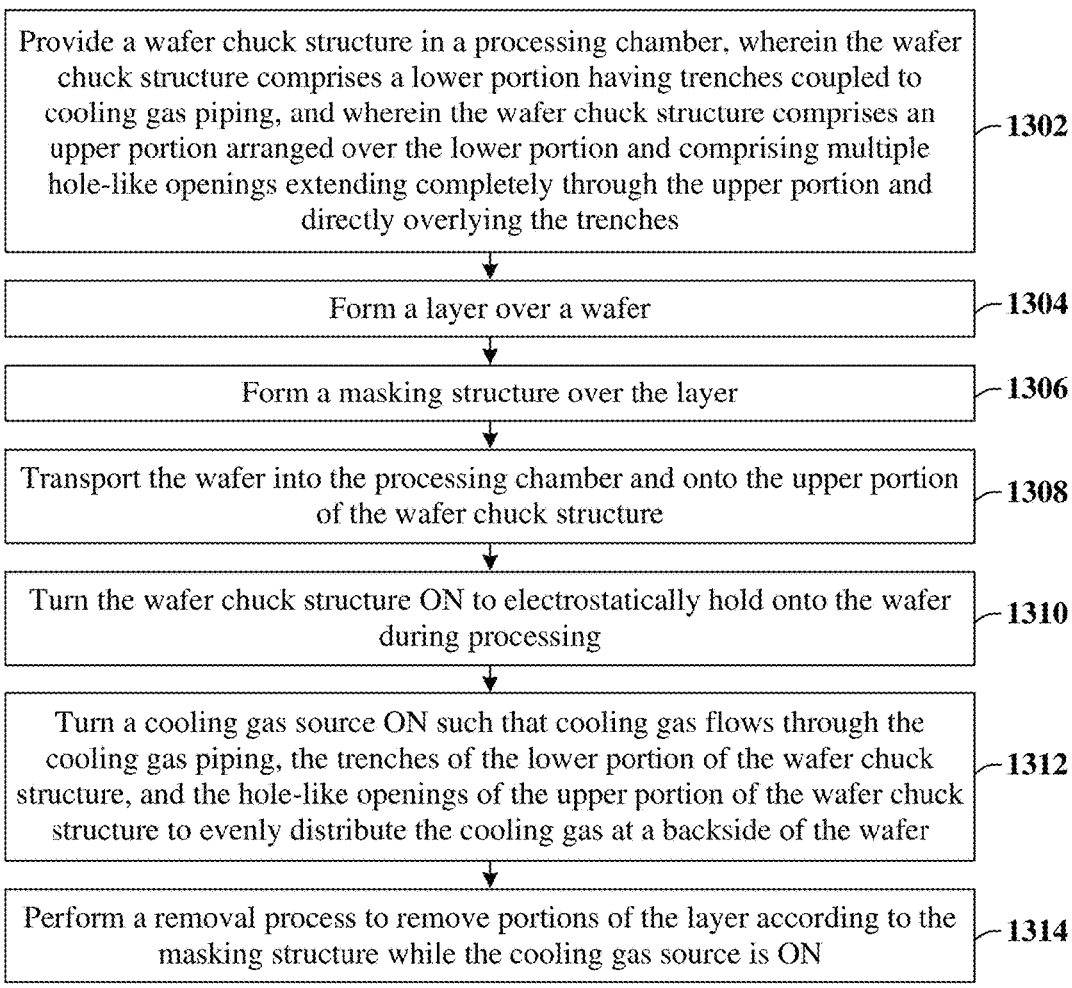
FIG. 13 illustrates a flow diagram of some embodiments of a method corresponding the method illustrated in FIGS. 7-12.

FIG. 13 illustrates a flow diagram of some embodiments of a method 1300 corresponding to the method illustrated in FIGS. 7-12.

While method 1300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1302, a wafer chuck structure is provided in a processing chamber. The wafer chuck structure comprises a lower portion having trenches coupled to cooling gas piping. The wafer chuck structure also comprises an upper portion arranged over the lower portion and comprising multiple hole-like openings extending completely through the upper portion and directly overlying the trenches. FIGS. 1 and 2 illustrate cross-sectional view 100 and top-view 200, respectively of some embodiments corresponding to act 1302.

At act 1304, a layer is formed over a wafer.

At act 1306, a masking structure is formed over the layer. FIG. 7 illustrates a cross-sectional view 700 of some embodiments corresponding to acts 1304 and 1306.

At act 1308, the wafer is transported into the processing chamber and onto the upper portion of the wafer chuck structure.

At act 1310, the wafer chuck structure is turned ON to electrostatically hold onto the wafer during processing. FIG. 8 illustrates a cross-sectional view 800 of some embodiments corresponding to acts 1308 and 1310.

At act 1312, a cooling gas source is turned ON such that a cooling gas flows through the cooling gas piping, the trenches of the lower portion of the wafer chuck structure, and the hole-like openings of the upper portion of the wafer chuck structure to evenly distribute the cooling gas at a backside of the wafer.

At act 1314, a removal process is performed to remove portions of the layer according to the masking structure while the cooling gas source is ON. FIGS. 9A-9C illustrate cross-sectional views 900A-900C of some embodiments corresponding to act 1314.

Therefore, the present disclosure relates to a wafer chuck structure comprising a topmost surface having hole-like openings coupled to cooling gas piping and configured to evenly distribute cooling gas to a wafer arranged over the wafer chuck structure during a removal process to improve control and reliability of the removal process.

Accordingly, in some embodiments, the present disclosure relates to a process tool comprising: a chamber housing defining a processing chamber; and a wafer chuck structure arranged within the processing chamber and configured to hold a wafer during a fabrication process, wherein the wafer chuck structure comprising: a lower portion comprising trenches extending from a topmost surface of the lower portion and towards a bottom surface of the lower portion, wherein bottommost surfaces of the trenches are defined by middle surfaces of the lower portion of the wafer chuck arranged between the topmost surface and the bottommost surface of the wafer chuck, an upper portion arranged over the lower portion and comprising openings that extend completely through the upper portion of the wafer chuck and directly overlie the trenches of the lower portion of the wafer chuck, cooling gas piping coupled to the trenches of the lower portion of the wafer chuck structure, and a cooling gas source coupled to the cooling gas piping and configured to direct cooling gas toward a top of the wafer chuck structure through the cooling gas piping, the trenches of the lower portion, and the openings of the upper portion during the fabrication process, wherein the openings of the upper portion of the wafer chuck structure are holes such that multiple openings of the upper portion of the wafer chuck structure directly overlie each trench of the lower portion of the wafer chuck structure.

In other embodiments, the present disclosure relates to a process tool comprising: a chamber housing defining a processing chamber; and a wafer chuck structure arranged within the processing chamber and configured to hold a wafer during a fabrication process, wherein the wafer chuck structure comprises: a lower portion comprising a first material and comprising trenches that extend from a topmost surface from the lower portion and towards a bottommost surface of the lower portion, an upper portion arranged over the lower portion, comprising a second material different than the first material, and comprising hole-like openings that extend completely through the upper portion and directly overlie the trenches of the upper portion, and a cooling gas source coupled to the lower portion and configured to direct a cooling gas at a specified temperature towards the upper portion of the wafer chuck structure through the trenches and openings of the wafer chuck structure, wherein the upper portion comprises a first number of openings, and wherein the lower portion comprises a second number of trenches, and wherein the first number is greater than the second number.

In yet other embodiments, the present disclosure relates to a method comprising: forming a layer over a wafer; forming a masking structure over the layer; transporting the wafer onto a wafer chuck structure arranged within a processing chamber, wherein the wafer chuck structure comprises a lower portion having trenches coupled to cooling gas piping, wherein the wafer chuck structure comprises an upper portion arranged over the lower portion and comprising multiple hole-like openings extending completely through the upper portion and directly overlying the trenches of the lower portion; turning the wafer chuck structure ON to electrostatically hold onto the wafer during processing; turning a cooling gas source ON such that a cooling gas flows through the cooling gas piping, the trenches of the lower portion of the wafer chuck structure, and the hole-like openings of the upper portion of the wafer chuck structure to evenly distribute the cooling gas towards a backside of the wafer; and performing a removal process to remove portions of the layer according to the masking structure while the cooling gas source is ON.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a layer over a wafer;
forming a masking structure over the layer;
transporting the wafer onto a wafer chuck structure arranged within a processing chamber, wherein the wafer chuck structure comprises a lower portion having a trench coupled to a cooling gas pipe, wherein the wafer chuck structure comprises an upper portion arranged over the lower portion and comprising a hole extending completely through the upper portion and directly overlying the trench, wherein the hole extends from a top surface of the wafer chuck structure to a top surface of the trench, wherein the hole has a first width at the top surface of the wafer chuck structure and a second width directly below the first width, the first width being larger than the second width;
turning the wafer chuck structure ON to electrostatically hold onto the wafer during processing;
turning a cooling gas source ON such that a cooling gas flows through the first width and the second width of the cooling gas pipe, the trench and the hole to evenly distribute the cooling gas towards a backside of the wafer; and
performing a removal process to remove portions of the layer according to the masking structure while the cooling gas source is ON.

2. The method of claim 1, wherein the trench has a bottom surface above a bottom surface of the lower portion.

3. The method of claim 2, wherein the trench has an upper surface coplanar with an upper surface of the lower portion.

4. The method of claim 1, wherein a topmost surface of the upper portion of the wafer chuck structure has a profile comprising peaks and valleys, wherein the wafer directly contacts the peaks and is spaced apart from the valleys of the topmost surface of the upper portion of the wafer chuck structure, and wherein the cooling gas travels between the valleys and a bottommost surface of the wafer.

5. The method of claim 1, wherein the removal process is an etching process, and wherein an etch rate of the etching process is controlled by a temperature of the cooling gas.

6. The method of claim 1, wherein the lower portion is coupled to an electrostatic chuck circuit which is configured to provide a voltage.

7. A method, comprising:
transporting a wafer onto a wafer chuck arranged within a chamber defining a processing chamber;
the wafer chuck arranged within the processing chamber and configured to hold the wafer during a fabrication process, wherein the wafer chuck comprises: piping that extends to a top surface of the wafer chuck, the piping having a first region having a first width at the top surface of the wafer chuck, and a second region directly below the first region and having a second width less than the first width; and
providing a cooling gas source coupled to the piping and configured to direct cooling gas toward a top of the wafer chuck through the first region and the second region of the piping during the fabrication process.

8. The method of claim 7, wherein the piping has a third region directly below the second region and having a third width, the third region of the piping extends through a lower portion of the wafer chuck, the first and second regions of the piping extend through an upper portion of the wafer chuck, and wherein the lower portion comprises a different material than the upper portion.

9. The method of claim 8, wherein the wafer chuck further comprises continuously connected ring structures that connect to the piping at the third region when viewed from a top-view of the wafer chuck.

10. The method of claim 8, wherein the first width is greater than the third width.

11. The method of claim 7, wherein the wafer chuck is an electrostatic chuck configured to hold the wafer during the fabrication process through electrostatic forces.

12. The method of claim 8, wherein the upper portion of the wafer chuck comprises a ceramic material.

13. The method of claim 7, further comprising:
transporting cooling water from a cool water source coupled to a lower portion of the wafer chuck into the lower portion of the wafer chuck during the fabrication process.

14. A method comprising:
transporting a wafer onto a wafer chuck arranged within a chamber defining a processing chamber, wherein the wafer chuck comprises:
a pipe that extends towards a top surface of the wafer chuck,
a lower portion comprising a first material and comprising a trench that extends from a top surface of the pipe towards the top surface of the wafer chuck,
an upper portion arranged over the lower portion, and comprising a second material different than the first material, and comprising an opening that extends from the top surface of the wafer chuck to a top surface of the trench, wherein a first width of the opening at the top surface of the wafer chuck is equal to a first value, and wherein a second width of the opening directly below the first width is equal to a second value, the second value being less than the first value, and
a cooling gas source coupled to the lower portion and configured to direct a cooling gas at a specified temperature towards the upper portion of the wafer chuck through the trenches and openings of the wafer chuck, wherein the upper portion comprises a first number of openings, and wherein the lower portion comprises a second number of trenches, and wherein the first number is greater than the second number; and
providing cooling gas to travel to the upper portion of the wafer chuck through the first width and the second width.

15. The method of claim 14, wherein the first material is a metal, and wherein the second material is a ceramic.

16. The method of claim 14, wherein a topmost surface of the upper portion has a profile comprising peaks and valleys, wherein when a wafer is arranged on the upper portion of the wafer chuck, the peaks and is spaced apart from the valleys of the topmost surface of the upper portion of the wafer chuck.

17. The method of claim 14, wherein the wafer chuck is an electrostatic chuck.

18. The method of claim 14, wherein the trench has a width equal to a third value, the third value being less than the first value.

19. The method of claim 18, wherein the second value is less than the third value.

20. The method of claim 14, wherein the cooling gas source comprises helium.

\* \* \* \* \*